United States Patent [19]

Ignatowicz

[11] Patent Number: 4,570,338

[45] Date of Patent: Feb. 18, 1986

[54] METHODS OF FORMING A SCREW TERMINAL

[75] Inventor: Alexander M. Ignatowicz, Rutherford, N.J.

[73] Assignee: AT&T Technologies, Inc., Berkeley Heights, N.J.

[21] Appl. No.: 419,367

[22] Filed: Sep. 20, 1982

[51] Int. Cl.[4] .......................... H05K 3/30; H05K 3/34; H01R 4/02

[52] U.S. Cl. ........................................ 29/845; 29/843; 339/17 C; 339/221 R; 339/263 R; 339/275 B

[58] Field of Search ............. 339/17 C, 198 R, 220 R, 339/221 R, 221 M, 263 R, 263 L, 95 R, 275 B; 29/842, 844, 845, 843

[56] References Cited

U.S. PATENT DOCUMENTS

| | | | |
|---|---|---|---|
| D. 262,864 | 2/1982 | Schavilje | D8/385 |
| 2,752,580 | 6/1956 | Shewmaker | 339/221 M X |
| 3,124,408 | 3/1964 | Oesterreicher | 339/263 R X |
| 3,792,412 | 2/1974 | Madden | 339/17 C |
| 3,816,820 | 6/1974 | Stanaitis | 339/263 R |
| 3,827,004 | 7/1974 | Vandenheuvel et al. | 339/221 R |
| 3,865,455 | 2/1975 | Berg et al. | 339/17 C |
| 3,975,078 | 8/1976 | Ammon | 339/221 M |
| 4,034,471 | 7/1977 | Bias | 29/842 |
| 4,181,385 | 1/1980 | Desantis et al. | 339/17 C |
| 4,216,576 | 8/1980 | Ammon et al. | 29/845 |

FOREIGN PATENT DOCUMENTS

| | | | |
|---|---|---|---|
| 2097605A | 11/1982 | United Kingdom | 339/95 R |

OTHER PUBLICATIONS

Bakulesh Patel, "Restraining Eyelet for Twist Pin Interconnect System", *Motorola Technical Developments,* vol. 2 (Jan. 1982) pp. 26–27.

*Primary Examiner*—Gil Weidenfeld
*Assistant Examiner*—Steven C. Bishop
*Attorney, Agent, or Firm*—W. O. Schellin

[57] ABSTRACT

A screw terminal (14) is formed on a circuit board (12) by inserting a typical terminal screw (22) in a thread-forming operation into a tube (27) of a rim-like seat (21). The screw (22) is inserted into the tube (27) to a predetermined depth which is equal to or greater than the thickness of the circuit board (12). After the insertion of the screw (22) into the seat (21), the seat (21) is inserted into an aperture (16) in the circuit board (12). The aperture (16) is of circular cross section of a diameter such that the wall of the aperture engages the edges of the tube (27) in interfering contact. In a preferred embodiment, the wall of the aperture (16) is metallized and the seat (21) is of a copper coated, low carbon steel. After insertion of the seat (21) into the aperture (16), the seat (21) is soldered to the aperture (16) in an operation which fills any gaps between the circuit board and the seat and fixes the position of the walls with the confines of the circuit board.

3 Claims, 5 Drawing Figures

METHODS OF FORMING A SCREW TERMINAL

TECHNICAL FIELD

The invention relates to screw terminals and to methods of forming such screw terminals in circuit boards. More particularly, the invention relates to a structure of a terminal sleeve or seat and to inserting the seat into, and attaching it to, a circuit board, such that a terminal screw inserted into the seat is capable of fastening a typical wire termination to the circuit board.

BACKGROUND OF THE INVENTION

Certain circuit boards, particularly of the type often used in power supply units, become routinely interconnected with typical insulated electrical conductors. At an end of such a conductor a portion of the insulation is typically stripped back and a closed or open terminal lug is attached to the conductor. Such terminal lug may then be fastened by a typically hardened clamping screw to a terminal seat on the circuit board.

In the past, terminal seats in circuit boards were often machined parts having blind, threaded passages leading from seat-type pedestals into stud-like extensions. The extensions were inserted into plated thru holes of circuit boards and soldered into place. The terminal lugs then became fastened to the pedestals by typical, hardened terminal screws.

A problem with machined screw terminal seats relates to typical dimensional tolerance ranges of mass produced screw threads. The insertion torque of the terminal screws tends to vary widely. In some instances the screws thread easily into the seat with little resistance. Thus, unless the screw heads are seated very firmly against the respective lugs, the screws, and hence the terminal lugs, exhibit a tendency to loosen and to become electrically disconnected, thereby rendering any associated apparatus defective.

Non-threaded terminal seats having extensions of triangular cross sections are commercially available. Such seats may be positioned and soldered into triangular apertures in a circuit board, and screws may be threaded into the initially non-threaded extensions. Threads form in portions of each of the three interior walls of the extensions, and the three corners of the extensions of the seats act as reliefs in thread-forming operations. Problems appear in orienting the extensions of such seats with respect to corresponding apertures through the circuit boards wherein the terminal seats are to become located.

Also, as a hardened screw is rotatably inserted into the cylindrical extension of the terminal seat to form the threads therein, wall portions engaged by the threads are urged outward and cause stresses in the circuit board. Such stresses are undesirable in that they tend to result in cracks in metallized areas. Such cracks, if they are allowed to progress, may ultimately bring about a failure in their host circuit board.

SUMMARY OF THE INVENTION

In accordance with the present invention a threaded terminal is formed in a circuit board by first forming a subassembly wherein a hardened screw is rotatably inserted into a passage of a non-threaded, quadrilateral, tube or hollow cylinder extending from a flange. The insertion of the screw forms threads in central wall portions of each of the four sides of the cylinder. The screw is inserted to a depth in the cylinder which is substantially and, at least, equal to the thickness of a circuit board wherein the terminal seat is to be formed. The cylinder and the screw in threaded engagement therewith are now inserted into a metallized thru hole of circular cross section in the circuit board. The thru hole is of such a diameter that the four edges of the cylinder interferingly engage the wall of the thru hole. In a preferred embodiment, the passage of the cylinder is a blind passage, and the closed end of the inserted cylinder thereafter becomes soldered to the metallized surface of the thru hole.

BRIEF DESCRIPTION OF THE DRAWING

The following detailed description of an embodiment of the invention and of its features and advantages will be best understood when read in reference to the accompanying drawing, wherein.

DETAILED DESCRIPTION

General Considerations

Figure 1:
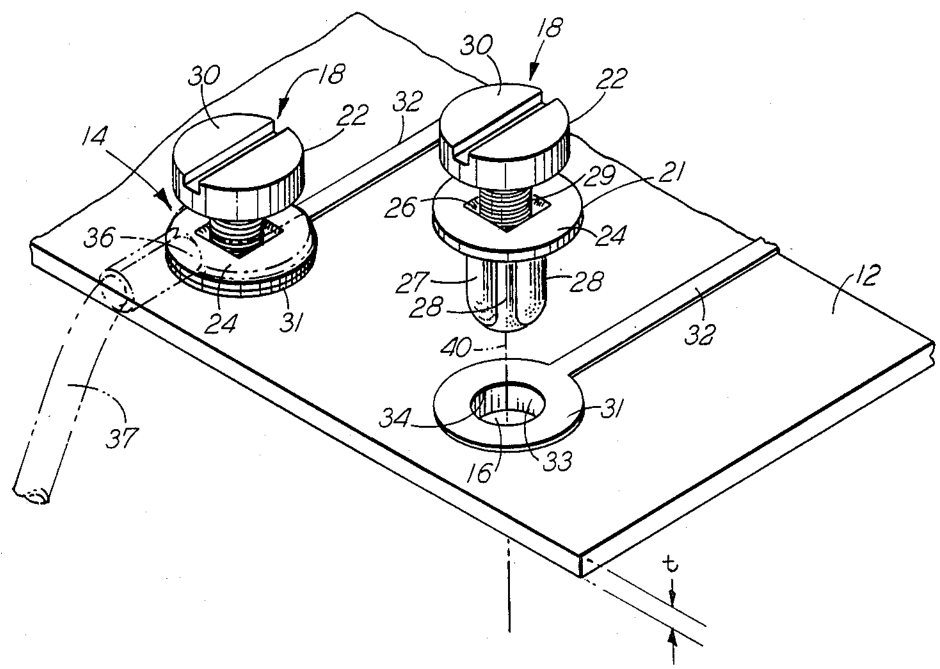
FIG. 1 is a pictorial view of a portion of a circuit board showing an assembly of a terminal seat and terminal screw inserted into an aperture of the circuit board, and a second assembly in an elevated position above a respective aperture of the circuit board.

FIG. 1 is a pictorial view of a portion of a circuit board 12, showing a screw terminal which is designated generally by the numeral 14. FIG. 1 further shows on the circuit board 12 an open thru hole or aperture 16 through which an assembly 18 of a terminal seat 21 and a terminal screw 22 (pictured in vertical alignment with the aperture 16) will be inserted to form the screw terminal 14.

The terminal seat 21 is a flange or substantially flat annular rim 24, from an inner opening 26 of which extends an otherwise closed cylindrical tube 27 of substantially square cross section. The base material of the terminal seat 21 is preferably of a low carbon steel which permits the seat to be die-formed from a strip of material. The four edges 28 of the tube 27 are typically rounded to accommodate the mechanics of the die-forming operation. A typical seat 21 to accommodate a number 4 type screw 21 (of approximately 2.8 mm outside diameter) may be formed of a material of 0.6 mm thickness. The die-forming process typically reduces the wall thickness of the tube 27 to a nominal dimension of 0.4 mm. A preferred length of the tube 27 from the underside of the rim 24 is only in nominal excess over the length (typically 5 mm) of the threaded shaft 29 of the screw 22, inasmuch as the insertion of the screw into the tube 27 is always diminished by the thickness of the rim 24 and by the thickness of any material clamped to the rim by the head 30 of the screw 22.

The low carbon steel base material of the seat 21 may further include a copper coating to enhance conductivity of the seat 21 as an electrical connector element. Such copper coating is preferably deposited in a typical plating operation. Thereafter, the copper plated surface of the seat 21 is solder coated, preferably again in a plating process. The solder coat eliminates the need for fluxing the surface of the seat 21 prior to a final assembly step, wherein the terminal seat 21 becomes soldered into the aperture 16 on the circuit board 12.

As shown in FIG. 1, the aperture 16 is surrounded by an annular metal land or contact pad 31 from which a conductive lead 32 extends as one of a plurality of typical, patterned conductors on circuit boards. Preferably, a cylindrical wall 33 of the aperture 16 is metallized in a typical copper plating operation to form a conductive thru hole coating 34. The thru hole coating 34 interconnects the pad 31 with a similar land 35 (see FIG. 5) on the far side of the circuit board 12.

The screw terminal 14 is formed in the circuit board 12 by inserting the assembly 18 into the aperture 16 and then soldering the tube 27 to the coating 34 in the aperture. Thereafter, a typical connector lug 36 at the end of a typical insulated conductor 37 may be coupled to the seat 21 with the screw fastened tightly to capture the lug 36 between the rim 24 and the head 30 of the screw 22. Advantages are derived from an initial, partial insertion of the screw 22 into the seat 21 to form the assembly 18, followed by the insertion of the assembly into the aperture 16. For a better understanding of the following description of some of the advantages, reference should be made to both FIGS. 1 and 2.

Figure 2:
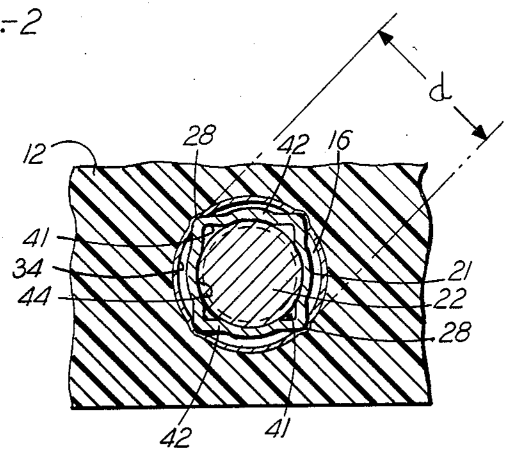
FIG. 2 is a cross-sectional view through the inserted terminal seat in FIG. 1, showing various advantages of the present invention.

FIG. 2 is a cross section of a portion of the circuit board 12, including the screw terminal 14, wherein the section is taken perpendicular to an axis 40 (see FIG. 1) extending longitudinally through the assembly 18.

Referring to FIG. 2, the spacing between mutually opposite inside surfaces 41 of sides or walls 42 of the tube 27 is preferably less than the outside thread diameter of the respective terminal screw 22 and greater than the root diameter of the screw 22. Thus, when the terminal screw 22 is rotatably inserted into the cylindrical tube 27, threads are formed in center portions 44 of the four walls 42. As the screw 22 is rotatably inserted into the tube 27, the walls also tend to alter their spacing by a slight amount. As a result, a diagonal dimension (d) across the tube 27 tends to decrease by a small and almost unnoticeable amount. The above-described change in the diagonal dimension which occurs prior to forming the terminal, before the assembly 18 is inserted into the circuit board 12, is believed to have an advantageous result during the insertion of the assembly into the circuit board in that it tends to relieve stresses which occur when the assembly 18 is inserted into its respective aperture 16.

Any change in the diagonal dimension (d) of the tube takes place only to the depth to which the screw is inserted into the tube 27. And, as shown in FIG. 1, in the assembly 18, the terminal screw 22 is only partially inserted into the terminal seat 21. However, the depth to which the terminal screw 22 is inserted into the cylindrical tube 27 of the terminal seat 21 is preferably about the same as, but no less than, a thickness (t) of the circuit board 12 into which the assembly 18 will be inserted (see FIG. 1).

The Seat and Screw Assembly

The partial insertion of the screw 22 into the tube 27 of the seat 21 to at least the thickness (t) helps to minimize additional stresses on the circuit board 12 after the screw terminal is formed and the screw is fully tightened to clamp the lug 36 to the rim 24 without sacrificing a friction hold of the tube 27 on the terminal screw 22.

Figure 3:
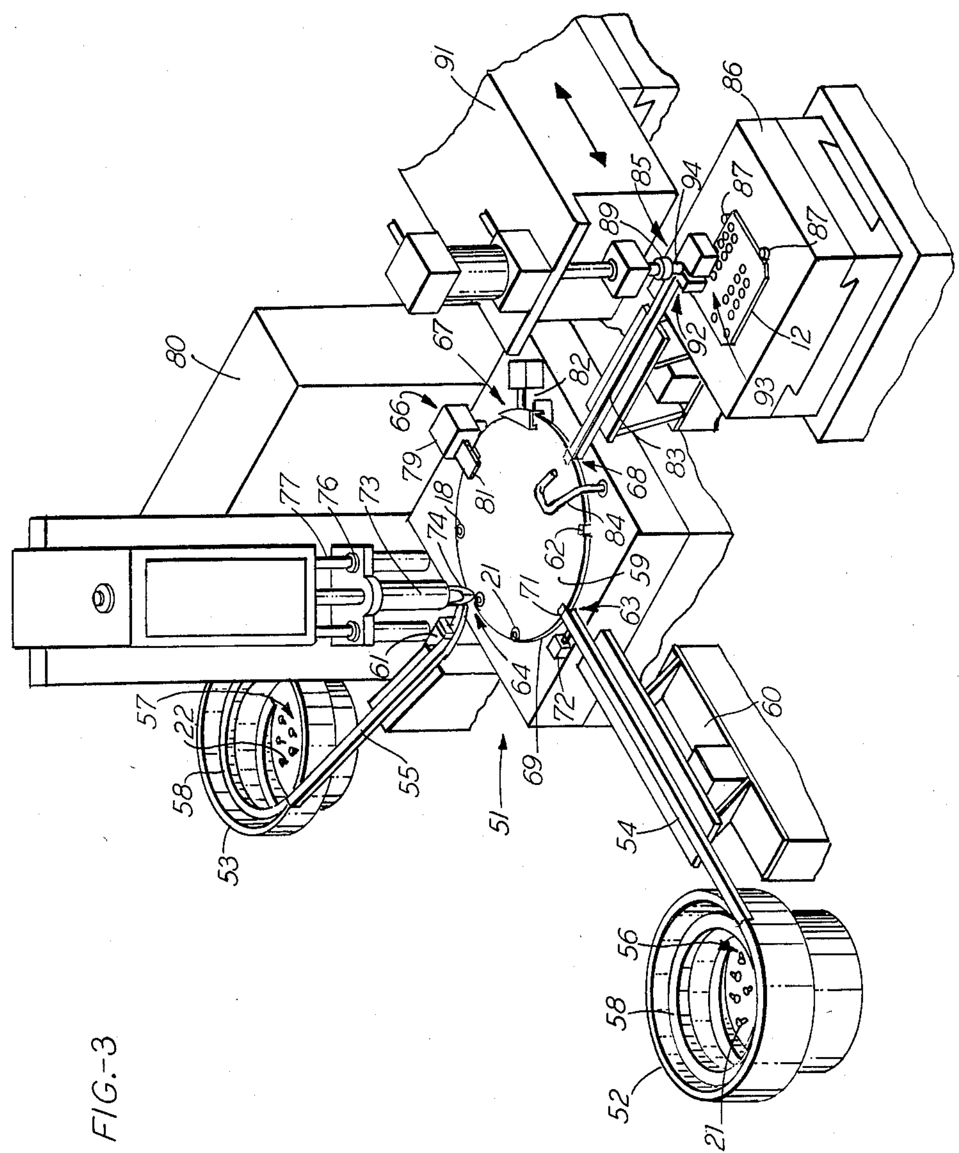
FIG. 3 is a simplified drawing of a typical apparatus which may be used in conjunction with carrying out a process of forming terminal seats in a circuit board in accordance with the present invention.

The assembly 18, wherein the terminal screw 22 is partially inserted into the terminal seat 21 may, of course, be formed manually with the aid of a screw driver (not shown). Preferably, known handling components may be adapted and combined into apparatus for inserting the screw 22 into the terminal seat 21. Referring to FIG. 3, there is shown a somewhat simplified pictorial view of a typical apparatus, designated generally by numeral 51, which may be used for forming the assembly 18, if, for example, in a commercial operation, an automated forming of the screw terminal 14 is preferred.

FIG. 3 shows two typical feeder bowls 52 and 53. Such feeder bowls are commonly used to feed small pieceparts from a bulk supply, wherein the pieceparts are randomly oriented, into a row of such pieceparts held in guide tracks, such as a vibratory track 54 or an inclined gravity feed track 55, wherein all of the pieceparts have the same orientation. Not all pieceparts may lend themselves to being fed from feeder bowls. Also, special mechanisms may typically be required to orient the pieceparts as they move from such feeder bowls onto the tracks. The orientation of the pieceparts may be sensed either mechanically or electrically, and those pieceparts which are not properly oriented are typically returned from the tracks to the feeder bowls.

The feeder bowls 52 and 53 move the pieceparts, namely the terminal seats 21 and the terminal screws 22, respectively, by vibratory agitation from a supply 56 and 57 in the center of the bowls 52 and 53 into upwardly inclined helical tracks 58. The helical tracks of the bowls 52 and 53 are coupled to the respective tracks 54 and 55 leading to a rotary index table 59. Magnetically operated vibrator spring supports 60 impart directional vibratory action to the track 54 to advance the seats 21 toward the index table 59. The screws 22 slide by gravity down the track 55 to a stop and escapement mechanism 61.

The rotary index table 59 of the apparatus 51 in FIG. 3 may employ any of a number of known indexing mechanisms. In a preferred embodiment, the table indexes through eight stop positions during each complete revolution to advance eight nests 62 in sequence. At only five of the eight positions a function is performed which is useful to the desired assembly operation. However, for smoother operation and simplicity of construction, an eight-position table is preferred. The nests 62 move in sequence from a terminal seat load position 63, to a screw insertion position 64, then to a test position 66 to a reject position 67 and thereafter to an assembly unload position 68. The nests 62 are adapted to slidably hold the terminal seats 21 in preferably parallel walled recesses of square cross section, located in the periphery 69 of the table 59 and which are open along the periphery of the table. Thus the nests have a shape very much like an open-ended wrench.

When moved into the terminal seat load position, each nest 62 becomes aligned with an end 71 of the track 54. A load mechanism 72, such as a typical mechanical reciprocating arm, when activated, urges one of the terminal seats 21 into the nest 62. In the nest 62, the terminal seat is loosely held with its longitudinal axis in a vertical position, and two walls of the cylindrical tubes are located between two spaced walls of the nest 62 with the rim 24 of the seat 21 resting on the rotary table 59.

The loaded terminal seat 21 is next indexed by the movement of the table 59 to the terminal screw insertion position 64. A typical, screw insertion head 73 is mounted to the apparatus 51 at the terminal screw insertion position 64, such that the loaded terminal seat 21 is moved into axial alignment with a rotatable chuck 74 of the head 73. The terminal screws 22 are fed in a typical manner from the supply 57 through the track 55 to the stop and escapement mechanism 61 which pushes them one by one into the insertion head 74 from where the chuck inserts each screw 22 into its respective seat 21. The depth of insertion of the screws 22 may be gauged by the number of revolutions of the chuck 73, or by depth stops 76 mounted to vertical guide rods 77.

Once the terminal screws 22 are inserted into the respective terminal seats 21, the assemblies 18 are complete. Consequently, the test position 66 of the index table 59 may be left vacant. However, it is preferred to provide at the test position 66 sensor 79 which is electrically coupled to a typical timing and control module 80 of the apparatus 51. The sensor has a feeler gauge 81 which is adjusted to a predetermined height above the table 59. If the screw 22 of the assembly 18 contacts the gauge 81 of the sensor 79, then the insertion depth of the screw 22 into the seat 21 is insufficient and the assembly 18 will be discarded at the reject unload position 67 of the table 59. A typical lateral trap door and wiper combination 82 sweeps a rejected assembly out of its respective nest 62.

In the absence of such a reject signal from the test position and as the nests 62 advance consecutively into the unload position 68, they become aligned with a typical vibratory feed track 83 similar to the track 54. A pneumatic jet 84 pushes the completed assemblies 18 from the nests 62 onto the track which advances them to an insert station 85.

Inserting the Assemblies

At the insert station 85, a programmably movable table 86, typically referred to and known as an "X-Y" table, may be indexed in two orthogonal directions into discrete, predetermined positions. Edge guides 87 on a top surface of the X-Y table 86 permit one of the circuit boards 12 to be positioned for assembly. A typical, vertical press head 89, which is capable of its vertical motion, is further mounted on a horizontal slide 91 to index between a pickup position 92 and an insert position 93.

Thus, in operation, the head 89 moves to the pickup position 92 where a vacuum operated chuck 94 grasps an assembly 18 from the track 83. The head 89 then moves to the insert position 93 and the assembly 18 is pressed into a prealigned one of the apertures 16 of the board 12.

Figure 4:
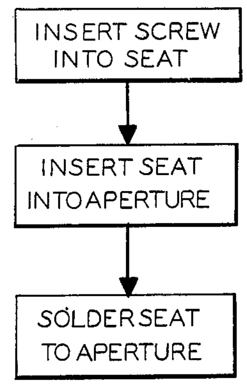
FIG. 4 is a block diagram setting forth a sequence of steps of a terminal forming process including features of the present invention.

The tube 27 of the assembly 18 is pushed fully into the aperture 16, such that the underside of the rim 24 contacts the metal land 31 surrounding the aperture 16 (see FIG. 1). Thereafter, in referring to the assembly steps outlined in FIG. 4, the assembly 18 is soldered to the circuit board 12 to complete the forming of the screw terminal 14. The solder operation is preferably delayed until after all other electrical components (not shown) which are to be mounted to the circuit board 12 are mechanically inserted. At that time, the circuit terminations of such components and the terminals 14 are preferably soldered in a typical wave soldering operation. Since the tube 27 protruding on the underside from the circuit board 12 is preferably closed, and the underside of the circuit board 12 is the side which is exposed to the solder wave, the inside of the tube remains free of solder.

The Terminal

Figure 5:
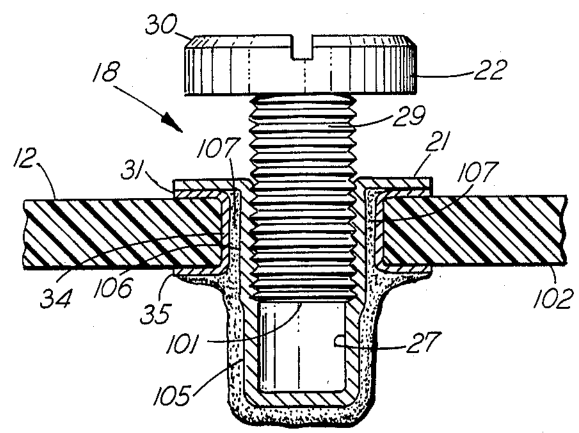
FIG. 5 is a sectional view through a circuit board, such as the board in FIG. 1, showing a seat inserted through an aperture in the circuit board.

Certain advantages of the described screw terminal 14 and of the method of forming the terminal 14 are best described in reference to FIGS. 2 and 5. As shown in FIG. 5, the terminal screw 22 is inserted into the seat 21 to a depth, such that upon insertion of the assembly 18 into the circuit board 12, a tip 101 of the screw 22 extends to a depth at least flush with a lower surface 102 of the circuit board 12.

In reference to FIG. 2, the insertion of the assembly 18 into the aperture 16 forces the edges 28 (shown as rounded corners in the sectional view) of the tube 27 into interfering contact with the metal coating 34 of the aperture 16. The interference between the wall of the aperture 16 and the edges 28 of the tube 27 is such that the metal coating of the aperture 16 and the wall of the aperture tend to yield. Any cracking of the metal coating 34, however, has been found to become filled in with solder and, thereby, becomes repaired during the soldering operation on the terminal 14. Referring to FIG. 5, upon insertion of a lowermost closed end 105 of the tube 27 through the aperture 16, an upper portion 106, wherein the terminal screw 22 is inserted becomes positioned within the aperture 16. Because of the presence of the terminal screw 22 within the upper portion 106 of the tube, the diagonal measurement across the edges 28 of the tube 27 tends to be less than the diagonal measurement across diagonally opposite edges 28 of the lowermost closed end 105 of the tube 27. A stress exerted against the wall of the aperture 16 in the circuit board 12 during the initial insertion of the lower end 105 becomes, therefore, less upon complete insertion of the assembly into the aperture 16.

The assembly consequently becomes seated within the respective aperture 16, upon being fully inserted. The referred to solder operation on the terminal seals any cracks and crevices in the coating 34 of the wall 33 of the aperture 16 and in its surrounding metal lands which may have been caused by the insertion of the assembly 18 into the aperture 16. Capillarity further fills the spaces between the walls of the aperture 16 and the tube with solder 107, thereby joining the assembly 18 with the circuit board 12 and fixedly establishing the spacial relationship between the tube and the circuit board 12.

After the screw terminal 14 has been formed in the described manner, the screw 22 may be threaded further into the seat 21 without affecting the spacial relationship between the walls of the tube 27 and the aperture 16. Thus when the screw 22 is fully tightened to fasten one or more of the terminal lugs 36 to the terminal 14, no further radial stress is generated in the circuit board 12 by the tightening of the screw 22.

However, the lower closed end 105 of the tube 27, because it extends below the circuit board 12, is capable of yielding and actually does yield under the thread rolling motion of the screw 21 as the screw is being tightened. The lowermost closed end portion 105 thereby grasps and holds the screw 22 tightly without adding any significant stress to the circuit board 12 itself.

As will be realized from the above description of the invention, various changes and modifications are possible without departing from the spirit and scope of the invention. For example, various changes may be made in the material of the seat 21 and, as previously pointed out, the assembly process is not dependent on the described apparatus 51. Therefore, the details of the above description should be regarded as illustrations to highlight the advantages of the present invention.

What is claimed is:

1. A method of forming a screw tetminal in a support plate of a first predetermined thickness, which comprises:

rotatably inserting a screw into a first end of a tube of a length greater than the first predetermined thickness of the plate and of quadrilateral cross section to form threads in portions of the walls of the tube from such first end downward toward a second end of the tube to a depth within the tube at least equal to the first predetermined thickness of the support plate and less than the length of the tube, such that a portion of the tube adjacent to such second end remains unthreaded; and inserting the tube into an aperture through the support plate by passing the unthreaded portion of the tube through the aperture and locating the threaded portion of the tube substantially within the aperture, said aperture having a circular cross section of a diameter less than a diagonal dimension across two nonadjacent edges of the tube, whereby the edges of the threaded portion of the tube become interferingly lodged against the wall of the aperture, the unthreaded portion of the tube protruding from such support plate, such that upon inserting the screw by further rotation within the tube and forming further threads in such unthreaded portion of the tube, the walls of the tube yield and resiliently hold the screw without adding significant stress to the support plate.

2. A method of forming a screw terminal according to claim 1, which further comprises:

filling spaces between the outer surface of the quadrilateral tube and the wall of the aperture through the support plate with a hardenable liquid; and hardening the liquid whereby the positions of the walls of the tube become fixed relative to the wall of the aperture within the confines of the thickness of the support plate.

3. A method of forming a screw terminal according to claim 2, wherein the support plate is a circuit board and the aperture is a metallized thru hole terminating in an annular metal pad about the thru hole on a first surface of the circuit board, and the tube is a metal tube having an annular rim at the first end and being closed off at the second end, and wherein:

the step of inserting the tube includes inserting said second end of said tube through the thru hole until said rim moves into contact with the metal pad; and the steps of filling the spaces and hardening the liquid include filling the spaces with liquid solder, whereby upon cooling of the solder, the solder solidifies and hardens.

* * * * *